United States Patent

[11] 3,609,479

[72] Inventors Hung Chang Lin
Silver Spring;
Karl Ka-Chung Yu, Laurel, both of Md.
[21] Appl. No. 709,344
[22] Filed Feb. 29, 1968
[45] Patented Sept. 28, 1971
[73] Assignee Westinghouse Electric Corporation
Pittsburgh, Pa.

[54] SEMICONDUCTOR INTEGRATED CIRCUIT HAVING MIS AND BIPOLAR TRANSISTOR ELEMENTS
1 Claim, 12 Drawing Figs.

[52] U.S. Cl. .................... 317/235, 307/304
[51] Int. Cl. .................... H01l 11/14
[50] Field of Search .................... 317/235 (22), 235 (22.2), 235 (40.12), 235 (221), 235 (22.11), 235 (21.1), 235 (22.1); 307/304

[56] References Cited

UNITED STATES PATENTS

| | | | |
|---|---|---|---|
| 3,246,214 | 4/1966 | Hugle | 317/235 |
| 3,264,493 | 8/1966 | Price | 307/88.5 |
| 3,356,858 | 12/1967 | Wanlass | 307/88.5 |
| 3,319,174 | 5/1967 | Hellstrom | 330/17 |
| 3,414,782 | 12/1968 | Lin et al. | 317/235 |
| 3,278,853 | 10/1966 | Lin | 330/24 |
| 3,454,789 | 7/1969 | Tyler | 307/305 |
| 3,461,361 | 8/1969 | Delivoras | 317/235 |

*Primary Examiner*—John W. Huckert
*Assistant Examiner*—Martin H. Edlow
*Attorneys*—F. Shapoe, C. Menzemer and G. H. Telfer

ABSTRACT: MIS and bipolar transistor elements are provided within a unitary body of semiconductor material wherein first and second regions of opposite conductivity type to that of the substrate provide source and drain regions between which is positioned an insulated gate electrode for the MIS transistor while in a region that may be the same as one of the source and drain regions or an additional region, elements of the bipolar transistor are provided with utilization of the substrate as a collector region or by having laterally disposed emitter and collector regions in a base region.

WITNESSES:

Helen M. Harkas

James F. Young

INVENTORS
Hung Chang Lin &
Karl Ka-Chung Yu
BY
Gordon H. Telfer
ATTORNEY

SEMICONDUCTOR INTEGRATED CIRCUIT HAVING MIS AND BIPOLAR TRANSISTOR ELEMENTS

BACKGROUND OF THE INVENTION

1. Field of the Invention

This invention relates to semiconductor integrated circuits for providing the functions of the plurality of electronic elements and particularly to those providing both bipolar transistor and MIS transistor elements.

2. Description of the Prior Art

The integrated circuit industry has pursued essentially divergent paths toward the provision of a greater number of circuit functions, and more complex circuit function, in a unitary body of semiconductor material. Traditionally bipolar transistors have predominated as the active elements in integrated circuits. However it has been recognized that devices generally referred to as MOS transistors, standing for metaloxide-semiconductor, would be advantageous in some respects particularly for providing a larger number of elements on a semiconductor body of given surface area. (The more general designation MIS, for metal-insulator-semiconductor, will be used herein.) However for truly high density MIS arrays, the individual MIS transistor must be of small size. As size is reduced, the transconductance of the device is also reduced and the ability of driving a heavy load, particularly a capacitive load is reduced. Consequently bipolar transistors have continued to be widely used, particularly in those applications requiring driving a low impedance utilization device, even though they require more unit area.

MIS transistors are also susceptible to permanent failure due to voltage surges breaking down the insulating layer under the gate electrode. Various protective devices have been proposed to prevent such damage however they tend to further reduce the extent at which high density arrays may be provided. Consequently, it has previously been impractical to achieve the principal advantages of MOS transistors without suffering some detriment in performance over that capable with bipolar transistor circuits.

The MIS transistor is similar in electrical operation to the previously known junction-type field-effect transistor, commonly called the unipolar transistor. However fabrication difficulties have impeded the utilization of the junction unipolar transistors in integrated circuits with bipolar transistors. Stelmak U.S. Pat. No. 3,173,101, March 9, 1965, and Lin and Yu U.S. Pat. NO. 3,210,677, Oct. 5, 1965 may be referred to for information on integrated circuits with bipolar and junction unipolar transistor elements.

SUMMARY OF THE INVENTION

Among the objects and advantages of the present invention are to provide improvement over the above-mentioned difficulties of the prior art by making it possible to utilize the high packing density of MIS transistors as well as the driving capability of bipolar transistors while at the same time minimizing the probability of breakdown of MIS gate dielectric and providing ease of fabrication.

According to the present invention these purposes are provided in a structure including a substrate of a first conductivity type having first, second, and third regions of a second conductivity type which preferably are the same in thickness and impurity concentration and hence may be simultaneously formed as by diffusion. Two of the regions provide source and drain regions between which is positioned an insulated gate electrode to provide a transistor generally of the MIS type. The third region provides a bipolar transistor base region. It may be the same region of material as one of the first and second regions or it may be a separate region spaced from them if circuit considerations require. The remainder of the bipolar transistor may be provided using an additional diffused region of the same conductivity type as the substrate in the third region as an emitter with the substrate providing the collector region. Alternatively, two regions of the same conductivity type as the substrate may be formed in the third region to provide laterally spaced emitter and collector regions.

DESCRIPTION OF THE PREFERRED EMBODIMENTS

Figure 1:
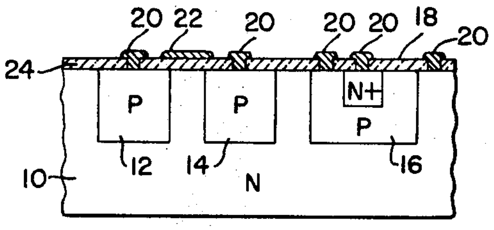
FIGS. 1, 2, 3, 4, and 5 are sectional views of alternative embodiments of the present invention.
Figure 2:
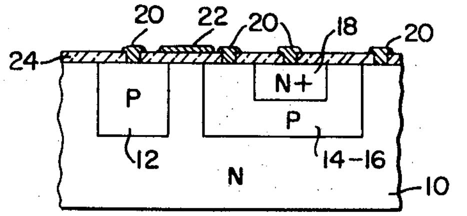

FIG. 1 illustrates a structure combining a P channel MIS transistor with an NPN bipolar transistor in a common collector configuration. In an N-type substrate 10 there are formed by simultaneous diffusion of an acceptor impurity three P-type regions 12, 14, and 16 of which regions 12 and 14 provide the source and drain of the MIS transistor while the third region 16 provides the phase region of the bipolar transistor. By an N+diffusion within the third region a transistor emitter region 18 is provided; at the same time a collector contact region (not shown) may also be formed in the substrate 10. Contacts 20 are made to each of the source and drain, base, emitter and substrate-collector regions and also a gate electrode 22 is disposed over the insulating layer 24 between the source and drain regions 12 and 14 on the surface of the device.

Where the circuit permits either of the drain or source of the MIS transistor to be connected to the base of the bipolar transistor, additional miniaturization can be achieved by making the base region common with one of the MIS regions as shown by region 14–16 in FIG. 2 wherein otherwise the elements are the same as in FIG. 1.

Figure 3:
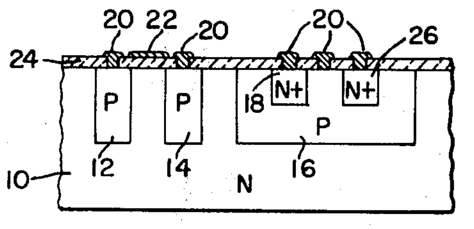

Often it is preferred that the substrate 10 not be utilized as the collector region. FIG. 3 shows it may be employed as merely a passive support by providing within the transistor base region 16 an additional N+ region 26, preferably simultaneously diffused with the emitter 18, and laterally spaced from it to provide a collector region. Otherwise the elements are as illustrated in the embodiment of FIG. 1.

Figure 4:
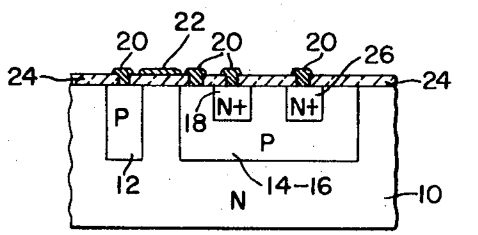

FIG. 4 is an embodiment combining features of both FIGS. 2 and 3. That is, the transistor base region is now common with one of the source and drain regions of the MIS transistor in region 14–16 and also lateral emitter and collector regions 20 and 26 are provided within the transistor base region.

Figure 5:
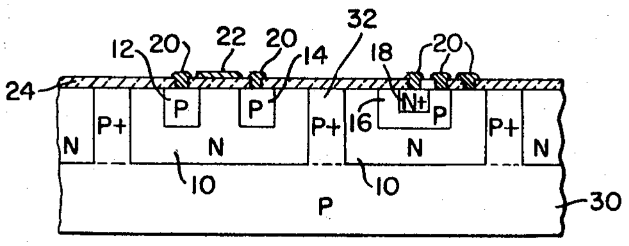

A modified structure of FIG. 2 is shown in FIG. 5. Here the P-channel MIS transistor is isolated from the NPN bipolar transistor by means of a conventional integrated circuit isolation technique, namely diffusing a P+ isolation wall 32 through an epitaxial layer (substrate 10) which is deposited on a P-type supersubstrate 30. Isolated portions 10 of the epitaxial layer provide individual areas for each transistor element. The regions of the transistors are formed as was discussed in connection with the previous figures.

By way of further example, integrated structures have been made successfully having the structure of FIG. 5 as follows:

Substrate 30: P-type Si, 10 to 40 ohm-cm.

Epitaxial layer 10: N-type, 2 ohm-cm. 10 microns thick

P+isolation wall 32 diffusion:

$$C_s=4\times10^{19}\ \text{a/cm.}^3.$$
$$\rho_s=6\ \text{ohms per square}$$

P-type base 16, source 12, and drain 14 diffusion:

$$C_s=3\times10^{18}\text{a./cm.}^3.$$
$$X_j=3.6\ \text{microns}$$
$$\rho_s=200\ \text{ohms per square}$$

N+18 emitter diffusion:

$$C_s=2\times10^{20}\text{a./cm.}^3.$$
$$X_j=2.6\ \text{microns}$$
$$\rho_s=5\ \text{ohms per square}$$

where $C_s$ is surface concentration, $X_j$ is junction depth, and $\rho_s$ is sheet resistivity. Selective diffusion using oxide masks and aluminum metallization were used.

In an integrated circuit electrically conductive means interconnecting the MIS transistor with the bipolar transistor is used. One such means is illustrated in the embodiments of FIGS. 2 and 4 by the common region 14–16, however, in other cases interconnection would be provided by metallization occurring over the insulating layer at the surface in the conventional manner of integrated circuit interconnections. Fabrication of structures in accordance with this invention is performed in accordance with the known selective diffusion techniques, employing for example oxide masking, as is presently practiced in integrated circuit fabrication.

The invention is particularly advantageous in that MIS elements may be minimized in size and provided in a large number within a single body of semiconductor material. For example, MIS transistors occupying an area of no more than about 10 square mils can be utilized because it is not necessary that they have a large driving capacity such as provided by the bipolar transistors. Additionally surge breakdown of the MIS transistors is minimized by reason of a bipolar transistor. When a bipolar transistor is buffered between an input terminal and the MIS transistor, any voltage surges which may otherwise damage the gate insulator will now appear at and be clamped by the input junction of the bipolar transistor.

Figure 12:
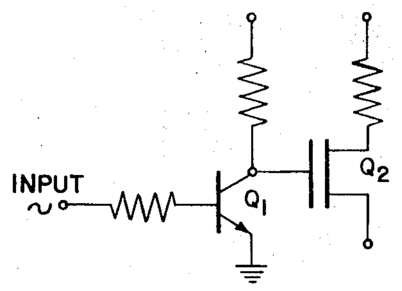
FIG. 12 is a circuit schematic illustrating a further application of the invention.

FIG. 12 illustrates the basis circuit configuration where $Q_1$ is a bipolar buffer element connected as shown to the gate of MIS transistor $Q_2$. A suitable voltage is applied to the collector of $Q_1$. $Q_2$ may be used as an MIS stage in the circuit types employing such elements, including those that employ additional bipolar elements. The input signal is applied through a suitable impedance to the base of $Q_1$.

Figure 6:
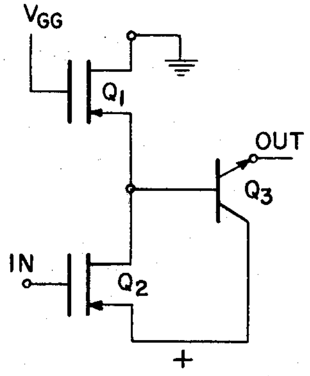
FIGS. 6, 7, 8, 9, and 10 are circuit schematics illustrating applications of the present invention.

The MIS and bipolar transistor integrated structure is useful in either linear or digital circuits. FIG. 6 illustrates a typical basic digital circuit configuration employing two MIS transistors $Q_1$ and $Q_2$ connected in the known manner to provide an inverter action with the bipolar transistor $Q_3$ connected at the MIS output for driving a heavy load greater than a few milliamperes.

Figure 7:
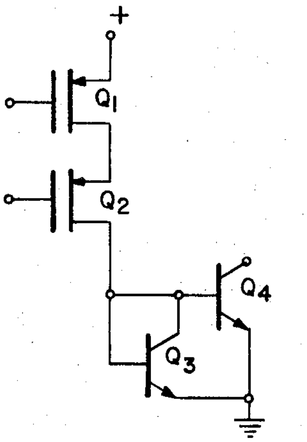

FIG. 7 illustrates a trigger circuit having a high input impedance as is advantageously provided by MIS transistors $Q_1$ and $Q_2$ and also having the capability of driving a heavy load by the utilization of the bipolar transistors $Q_3$ and $Q_4$ as illustrated one of which, $Q_3$, has its collector connected to its base region to provide a diode function.

Figure 8:
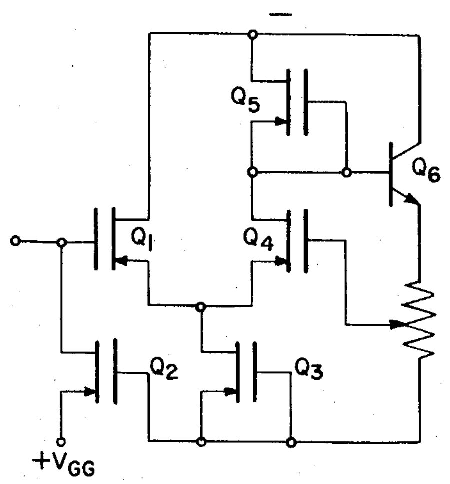

FIG 8 shows a video amplifier utilizing the principles of the present invention where a plurality of MIS transistors $Q_1$, $Q_2$, $Q_3$, $Q_4$, and $Q_5$ are arranged for successive amplification with a bipolar transistor $Q_6$ at the output of the last MIS stage.

Figure 9:
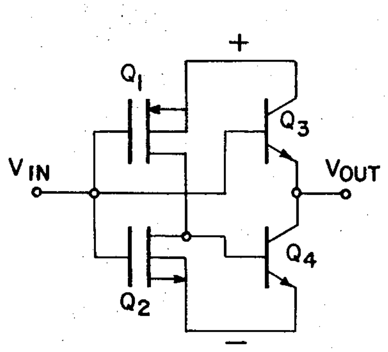
Figure 10:
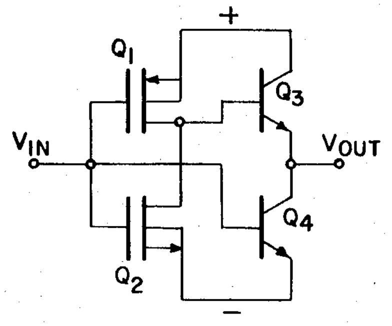

Combinations of field effect transistors of a single channel type and bipolar transistors are not well suited to static switching systems because of difficulty in turning off a bipolar transistor. The solution is to use complementary (i.e., both P-channel and N-channel) MIS transistors in an inverter configuration driving a bipolar transistor pair as shown in FIGS. 9 and 10. In FIG. 9 complementary transistors $Q_1$ and $Q_2$ are connected as an inverter having an output that goes to the level of the positive power supply in one logic state and goes to ground potential in the other logic state, since only one of the two transistors $Q_1$ and $Q_2$ can be on at one time. If the input of the inverter is also fed from some other complementary MIS stages, the input $V_{IN}$ should also experience a voltage swing from 0 to $V_{DD}$, the positive power supply. When the base of a bipolar transistor is at ground potential, it is cut off. Thus only one of the bipolar transistors $Q_3$ or $Q_4$ is on at one time and bidirectional drive is achieved. FIG. 10 is similar but has some difference in circuit connections so the output is the inverse of that occurring in FIG. 9.

Figure 11:
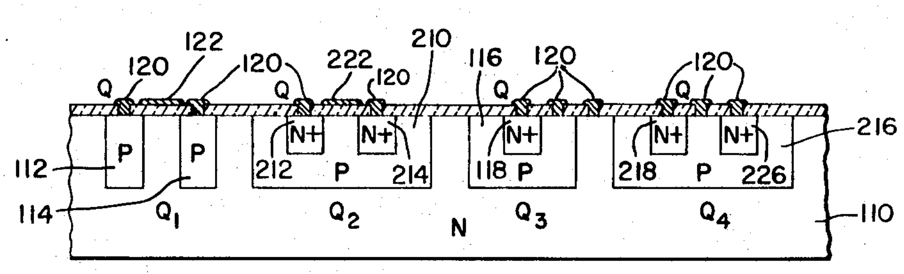
FIG. 11 is a sectional view of a further embodiment of the invention.

Integrated structures to provide functions of the circuits of FIGS. 9 and 10, as well as other circuits employing complementary MIS transistors with one or more bipolar transistors, may be provided as shown in FIG. 11. This structure provides four transistors $Q_1$, $Q_2$, $Q_3$, and $Q_4$, corresponding to the transistors of FIGS. 9 and 10. $Q_1$ is a P-channel MIS device like those of either FIG. 1 or FIG. 3 having source and drain regions 112 and 114 with contacts 120 and gate electrode 122. $Q_3$ is a bipolar transistor like that of FIG. 1 having base region 116, emitter region 118, and a collector provided by the substrate 110, each with a suitable contact 120. $Q_4$ is a bipolar transistor like that of FIG. 3 including base, emitter, and collector regions 216, 218, and 226 respectively, each with a contact 120. $Q_2$ is an N-channel MIS device including N+-type source and drain regions 212 and 214 in a P-type substrate region 210 with a contact 120 on each of the source and drain regions and a gate electrode 222. All of the P-type regions 112, 114, 210, 116, and 216 may be formed in a single diffusion operation with the same depth and impurity concentration profile. All of the N+ regions 212, 214, 118, 218, and 226 may also be formed in a single diffusion operation with the same depth and impurity concentration profile.

Other structures, such as those in which each transistor is in an isolated N-type region (similar to FIG. 5), may also be formed. The transistors may be formed in a variety of circuits having complementary MIS transistors with bipolar transistors of the various types known in integrated circuit fabrication. Reverse conductivity type for the different regions of the described structures may also be used.

While the present invention has been shown and described in the few forms only it will be apparent that various changes and modification may be made without departing from the spirit and scope thereof.

We claim:

1. A semiconductor integrated circuit structure including both MIS and bipolar transistor elements and comprising: a substrate of a first conductivity type; first and second regions of a second conductivity type in said substrate; an insulated gate electrode over the surface of said substrate between said first and second regions forming, with said first and second regions, a first MIS transistor; a third region of said second conductivity type in said substrate, a source and a drain region both of said first conductivity type in said third region of second conductibity type, an insulated gate electrode over the surface of said third region between said source and said drain regions of said first conductivity type forming with said source and drain regions a second MIS transistor, said first and second MIS transistors being complementary, a fourth region of said second conductivity type in said substrate in a position coincident with one of said first and second regions or spaced from said first and second regions; fifth and sixth regions of said first conductivity type in said fourth region and spaced from said substrate to form with said fourth region, a bipolar transistor.